(12) United States Patent
Street et al.

(10) Patent No.: US 10,748,857 B2
(45) Date of Patent: Aug. 18, 2020

(54) DIE FEATURES FOR SELF-ALIGNMENT DURING DIE BONDING

(71) Applicant: Micron Technology, Inc., Boise, ID (US)

(72) Inventors: Bret K. Street, Meridian, ID (US); Wei Zhou, Boise, ID (US); Christopher J. Gambee, Caldwell, ID (US); Jonathan S. Hacker, Meridian, ID (US); Shijian Luo, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/127,769

(22) Filed: Sep. 11, 2018

(65) Prior Publication Data

US 2020/0083178 A1 Mar. 12, 2020

(51) Int. Cl.
*H01L 23/00* (2006.01)
*H01L 25/065* (2006.01)
*H01L 25/00* (2006.01)

(52) U.S. Cl.
CPC ............ *H01L 23/562* (2013.01); *H01L 24/17* (2013.01); *H01L 24/81* (2013.01); *H01L 25/0657* (2013.01); *H01L 25/50* (2013.01); *H01L 24/13* (2013.01); *H01L 2224/13* (2013.01); *H01L 2224/13099* (2013.01); *H01L 2224/17517* (2013.01); *H01L 2224/81143* (2013.01); *H01L 2224/81191* (2013.01); *H01L 2225/06513* (2013.01); *H01L 2225/06593* (2013.01); *H01L 2924/014* (2013.01); *H01L 2924/3511* (2013.01)

(58) Field of Classification Search
CPC ....... H01L 23/562; H01L 24/17; H01L 24/81; H01L 25/0657; H01L 25/50; H01L 2924/014; H01L 2224/13099
See application file for complete search history.

(56) References Cited

U.S. PATENT DOCUMENTS

| | | | |
|---|---|---|---|
| 2013/0221519 A1* | 8/2013 | Hwang | H01L 23/49811 257/737 |
| 2013/0280861 A1* | 10/2013 | Ma | H01L 21/563 438/107 |
| 2014/0203428 A1* | 7/2014 | Colgan | |
| 2015/0380455 A1* | 12/2015 | Sugimoto | H01L 24/14 257/448 |
| 2017/0040276 A1* | 2/2017 | Morris | H01L 24/81 |
| 2018/0090408 A1* | 3/2018 | Tsai | H01L 23/4952 |

* cited by examiner

*Primary Examiner* — Patricia D Reddington
(74) *Attorney, Agent, or Firm* — Parsons Behle & Latimer (57) ABSTRACT

A semiconductor device assembly that includes a substrate having a first side and a second side, the first side having at least one dummy pad and at least one electrical pad. The semiconductor device assembly includes a first semiconductor device having a first side and a second side and at least one electrical pillar extending from the second side. The electrical pillar is connected to the electrical pad via solder to form an electrical interconnect. The semiconductor device assembly includes at least one dummy pillar extending from the second side of the first semiconductor device and a liquid positioned between an end of the dummy pillar and the dummy pad. The surface tension of the liquid pulls the dummy pillar towards the dummy pad. The surface tension may reduce or minimize a warpage of the semiconductor device assembly and/or align the dummy pillar and the dummy pad.

16 Claims, 6 Drawing Sheets

DIE FEATURES FOR SELF-ALIGNMENT DURING DIE BONDING

FIELD

The embodiments described herein relate to using surface tension of a liquid, which may be solder, to reduce or minimize warpage and/or align components of a semiconductor device assembly.

BACKGROUND

Semiconductor processing and packaging techniques continue to evolve to meet industry demands for increased performance and reduced size. Electronic products, such as cell phones, smart phones, tablets, personal digital assistances, laptop computers, as well as other electronic devices, require packaged semiconductor assemblies having a high density of devices while having a relatively small footprint. For example, the space available for memory devices, processors, and other devices, continues to decrease in electronic products providing a need to increase the density of semiconductor devices. The thickness of semiconductor devices is continually being decreased to reduce the size of semiconductor device packages. One method to increase the density of semiconductor devices is stacking of semiconductor devices to form a semiconductor device assembly.

During the process of forming a semiconductor device assembly, the assembly may go through various processes having an elevated temperature. For example, the temperature during a reflow process to create solder joints, or interconnections, between semiconductor devices may reach an elevated temperature, such as 260 degrees Celsius. The elevated temperature may vary depending on the components of the semiconductor device assembly as well as the processes being used to form the assembly as would be appreciated by one of ordinary skill in the art.

A semiconductor device assembly may be comprised of various components such as, but not limited to, a substrate, semiconductor devices, and mold compound. Each of the components may have different coefficients of thermal expansion (CTE), which may create potential problems. As the semiconductor device assembly is subjected to an elevated temperature, the semiconductor device assembly may experience warpage due to the different CTEs of the individual components of the assembly. Warpage may provide a large amount of stress on the components of the assembly. If the warpage is too large, the warpage may create reliability issues with the interconnections within a semiconductor device assembly. For example, a warpage larger than, but not limited to, 50 microns may result in solder joint reliability issues.

Warpage may create problems in connecting a semiconductor device to a board, substrate, or to another semiconductor device. Warpage may make it very difficult to connect the two semiconductor devices. For example, warpage may cause a break in an interconnect between the two semiconductor devices if the warpage increases the distance between the two semiconductor devices. Conversely, warpage may cause a short between two adjacent interconnects if the warpage decreases the distance between the two semiconductor devices. A decrease in distance may cause the interconnect material, which may be solder, to expand laterally towards an adjacent interconnect as would be appreciated by one of ordinary skill in the art having the benefit of this disclosure. Additionally, warpage may cause components of the two semiconductor devices that are to be connected together to be misaligned.

Additional drawbacks and disadvantages may exist.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices and semiconductor device packages may not be shown and/or may not be described in detail to avoid obscuring other aspects of the disclosure. In general, it should be understood that various other devices, systems, and/or methods in addition to those specific embodiments disclosed herein may be within the scope of the present disclosure.

The terms "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, semiconductor device packages, and methods of making and/or operating semiconductor devices.

An embodiment of the disclosure is a semiconductor device assembly comprising a substrate having a first side and a second side, the first side having at least one dummy pad and at least one electrical pad. The semiconductor device assembly comprises a first semiconductor device having a first side and a second side and at least one electrical pillar extending from the second side of the first semiconductor device. The at least one electrical pillar is connected to the at least one electrical pad via solder to form an electrical interconnect between the first semiconductor device and the substrate. The semiconductor device assembly comprises at least one dummy pillar extending from the second side of the first semiconductor device and a liquid positioned between an end of the at least one dummy pillar and the at least one dummy pad. The surface tension of the first liquid pulls the at least one dummy pillar towards the at least one dummy pad.

An embodiment of the disclosure is a semiconductor device comprising a substrate having a first side and a second side, the first side having an area. The semiconductor device comprises a plurality of electrical pads on the first side with each of the plurality of electrical pads being configured to be connected to an electrical pillar to form an electrical connection. The semiconductor device comprising a plurality of dummy pads on the first side with each of the plurality of dummy pads configured to be aligned with a plurality of pillars via surface tension of a fluid to be positioned between each of the plurality of dummy pads and a corresponding pillar of the plurality of pillars. The plurality of dummy pads may have a combined area that is at least ⅛ as large as the area of the first side of the substrate.

An embodiment of the disclosure is a method of making a semiconductor device assembly. The method comprises providing a substrate having a first surface and a second surface opposite the first surface with at least one dummy pad on the first surface. The method comprises providing a first semiconductor device having a first surface and a second surface opposite the first surface with at least one dummy pillar extending from the second surface. The method comprises positioning the at least one dummy pillar adjacent to the at least one dummy pad, wherein a surface tension of a fluid positioned between the at least one dummy pillar and the at least one dummy pad applies a force pulling the at least one dummy pillar and the at least one dummy pad toward each other.

Figure 1:
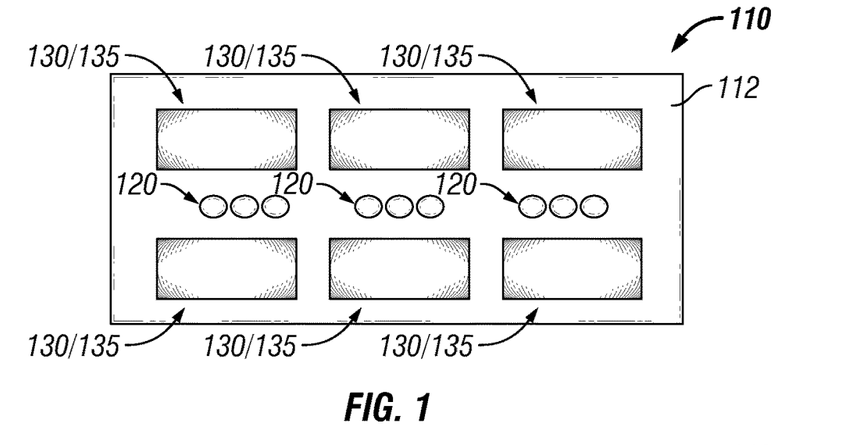
FIG. 1 is a bottom view schematic of an embodiment of a semiconductor device.
Figure 2:
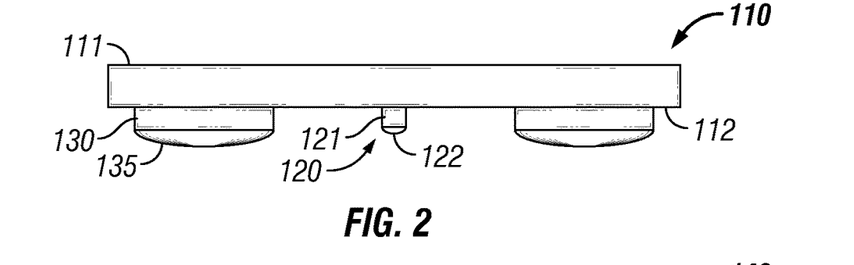
FIG. 2 is side view schematic of the semiconductor device of FIG. 1.

FIG. 1 is a is a bottom view schematic of an embodiment of a semiconductor device 110. The semiconductor device 110 has a first, or top, side 111 (best shown in FIG. 2) and a second, or bottom, side 112. FIG. 2 is a side view schematic of the semiconductor device 110. A plurality of electrical pillars 120 extend from the second side 112 of the semiconductor device 110. The electrical pillars are configured to mate with a corresponding electrical pad 150 (shown in FIGS. 3 and 4) on a first, or top, side 141 (shown in FIG. 4) of an adjacent substrate 140 (shown in FIG. 3 or 4) of a first, or top, side of an adjacent semiconductor device as discussed herein. The electrical pillars are comprised of a pillar 121 that extends from the second side 112 of the semiconductor device 110 with solder 122 positioned on the end of each pillar 121. The electrical pillars 120 and corresponding electrical pads 150 are configured to form an electrical interconnect between the semiconductor device 110 and the adjacent substrate 140 or the adjacent semiconductor device. The adjacent substrate may be a semiconductor device as would be appreciated by one of ordinary skill in the art having the benefit of this disclosure. The number, location, size, and/or configuration of the electrical pillars 120 are shown for illustrative purposes and may be varied depending on the application as would be appreciated by one of ordinary skill in the art having the benefit of this disclosure.

A plurality of dummy pillars 130 extend from the second side 112 of the semiconductor device 110. Fluid 135 is positioned on the end of each dummy pillar 130. In an embodiment the fluid 135 may be, but is not limited to, solder. The dummy pillars 130 are configured to engage a dummy pad 160 (shown in FIGS. 3 and 4) located on the first, or top, side 141 of the adjacent substrate 140 or on a first, or top, side of an adjacent semiconductor device. As discussed above, the substrate 140 may be a semiconductor device. A surface tension of the fluid 135 may be used to self-align the dummy pillar 130 with the dummy pad 160 as discussed herein. Likewise, the surface tension of the fluid 135 may be used to pull the dummy pillar 130 towards the dummy pad 160 as discussed herein. The pulling force of the surface tension of the fluid 135 may be used to minimize or reduce a warpage of the semiconductor device 110 and/or a warpage of the substrate 140 as discussed herein.

Dummy pads 160 and dummy pillars 130 may be configured to reduce warpage of the semiconductor device 110 and/or the substrate 140. The dummy pads 160 and dummy pillars 130 may be configured in a pattern based on the warpage. For example, the pattern may position the dummy pillars 130 and dummy pads 160 at the perimeter of the two devices. Various configurations of dummy pillars 130 and dummy pads 160 may be used depending on the warpage of the devices as would be appreciated by one of ordinary skill in the art having the benefit of this disclosure.

As used herein, the term dummy means that the pillar and/or pad are not configured to form an electrical interconnection between the semiconductor device 110 and the adjacent substrate or semiconductor device. The number, location, size, and/or configuration of the dummy pillars 130 and/or fluid 135 are shown for illustrative purposes and may be varied depending on the application as would be appreciated by one of ordinary skill in the art having the benefit of this disclosure. For example, in some embodiments the fluid 135 may be positioned on the dummy pads 160 instead of on the end of the dummy pillars 130 prior to connecting the dummy pillars 130 to the dummy pads 160.

Figure 3:
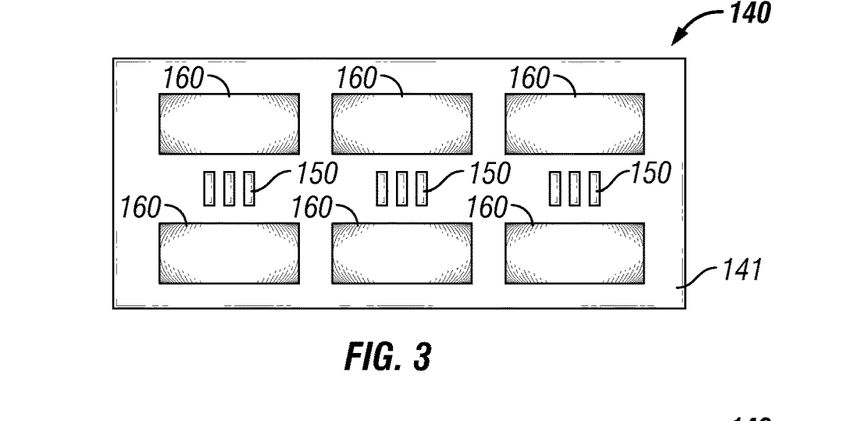
FIG. 3 is a top view schematic of an embodiment of a substrate.
Figure 4:
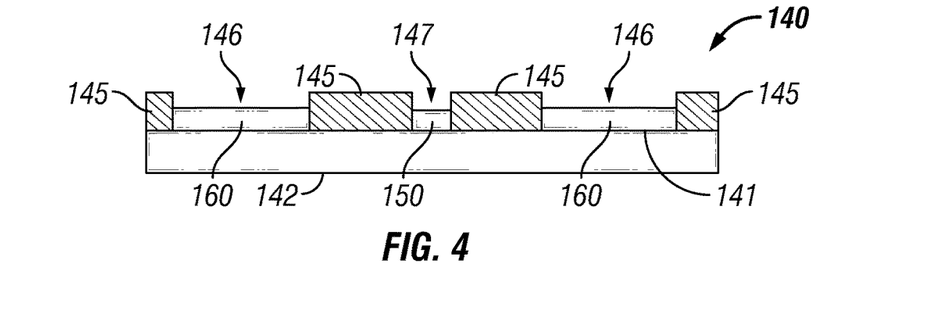
FIG. 4 is a side view schematic of the substrate of FIG. 3.

FIG. 3 is a is a top view schematic of an embodiment of a substrate 140. The substrate device 140 has a first, or top, side 141 and a second, or bottom, side 142 (best shown in FIG. 4). FIG. 4 is a side view schematic of the substrate 140. The first side 141 of the substrate 140 includes a plurality of electrical pads 150 that are configured with the electrical pillars 120 to form electrical interconnects between the semiconductor device 110 and the substrate 140 as discussed above. A solder mask 145 may be positioned on the first surface 141 of the substrate 140 and the electrical pads 150 may be positioned within openings of the solder mask 145 creating a recess or cavity 147. The first side 141 of the substrate 140 also includes a plurality of dummy pads 160 that are configured mate with the dummy pillars 130 that extend from the second side 112 of the semiconductor device 110.

As discussed herein, the dummy pillars 130 and dummy pads 160 do not form electrical interconnects between the semiconductor device 110 and the substrate 140. The dummy pads 160 may be positioned within openings of the solder mask 145 creating a recess or cavity 146 above the dummy pads 160. The recess or cavity 146 may be used to retain the fluid 135 that is positioned between the dummy pillars 130 and the dummy pads 160. The number, location, size, and/or configuration of the solder mask 145, electrical pads 150, and/or dummy pads 160 are shown for illustrative purposes and may be varied depending on the application as would be appreciated by one of ordinary skill in the art having the benefit of this disclosure.

Figure 5:
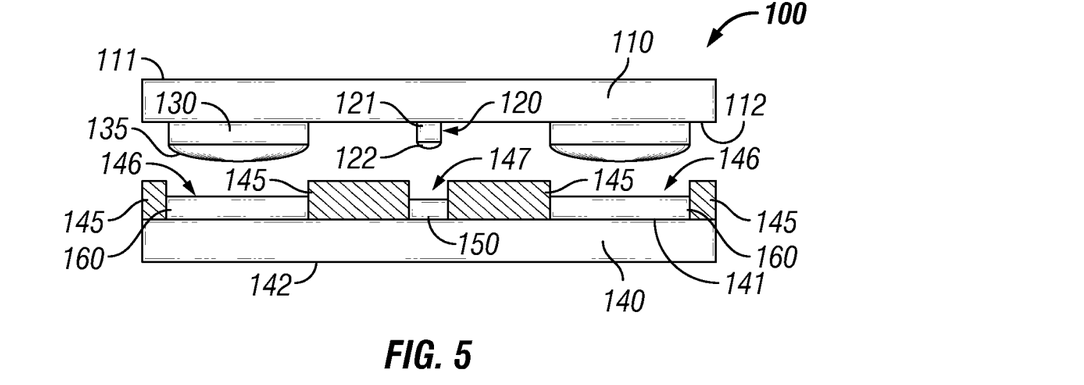
FIG. 5 is a schematic of an embodiment of a semiconductor device and a substrate being positioned adjacent to each other to form a semiconductor device assembly.
Figure 6:
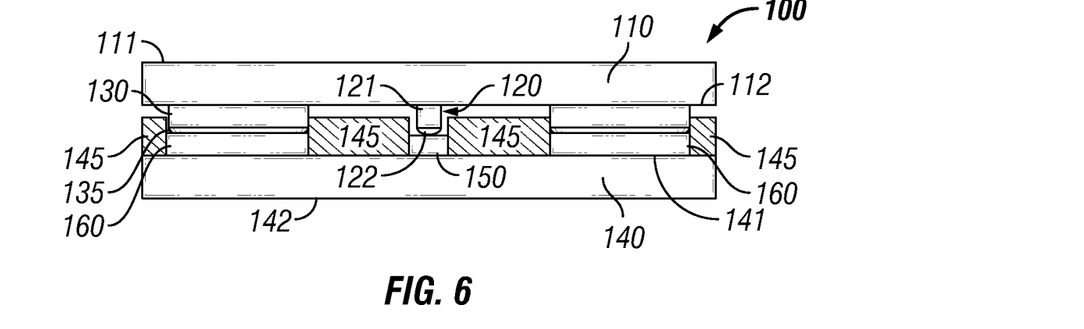
FIG. 6 is a schematic of the semiconductor device assembly of FIG. 5 with the semiconductor device connected to the substrate.

FIG. 5 shows a side view schematic of the semiconductor device 110 being positioned adjacent to the substrate 140 in the process of forming a semiconductor device assembly 110 (best shown in FIG. 6). As the semiconductor device 110 and substrate 140 are brought together, the surface tension of the fluid 135, which is positioned between each dummy pillar 130 and corresponding dummy pad 160, pulls the dummy pillar 130 and dummy pad 160 together. The pulling force of the fluid 135 may be used to self-align the dummy pillar 130 with the dummy pad 160.

FIG. 6 shows a side view schematic of the semiconductor device assembly 100 comprising the semiconductor device 110 connected to the substrate 140. The electrical pillars 120 and electrical pads 150 provide for electrical interconnections between the semiconductor device 110 and the substrate 140. If the area of the fluid 135 over the surfaces 112, 141 of the semiconductor device 110 and substrate 140 is large enough, the surface tension of the fluid 135 may be able to reduce or minimize a warpage of the semiconductor device 110 and/or substrate 140 as the semiconductor device assembly 100 is subjected to elevated temperatures during the formation process. For example, if the total area of the dummy pads 160 and thus, the total area of fluid 135 is at least $1/8^{th}$ as large as the total area of the second surface 112 of the semiconductor device 110, the force applied by the surface tension of the fluid 135 to the semiconductor device 110 by the dummy pillars 130 may be sufficient to reduce or minimize the warpage of the semiconductor device 110.

In one embodiment, the fluid 135 may be solder and the dummy pillars 130 and dummy pads 160 may be comprised of metal. Other fluids and materials may be used that enable surface tension to potentially self-align the dummy pillars 130 with the dummy pads 160 and/or minimize warpage of a component of a semiconductor device assembly as would be appreciated by one of ordinary skill in the art having the benefit of this disclosure. The dummy pads 160 and dummy pillars 130 may be comprised of, but are not limited to, copper, nickel, gold, or combinations thereof. The fluid 135 may be comprised of, but is not limited to, water, glycerol, diiodomethane, formamide, tin solder, tin silver solder, indium solder, epoxy resin, or combinations thereof. The surface(s) 112, 141 and/or dummy pillars 130 and dummy pads 160 of the semiconductor device 110 and/or substrate 140 may need to be treated prior to forming the semiconductor device assembly 100 to adequately ensure that the surface tension of the fluid 135 imparts a sufficient force for alignment purposes and/or to reduce warpage.

In order to alter the self-alignment force developed through surface tension, a variety of surface condition treatments can be utilized prior to the connection of the dummy pillars 130 to the dummy pads 160. Various surface condition treatments may be used to alter the surface chemistry of a component, or components, in such a way that the surface energy is adjusted for optimum process conditions enhancing the surface tension forces that may be used for self-alignment as would be appreciated by one of ordinary skill in the art having the benefit of this disclosure. For example, the surface condition treatment may be, but is not limited to, liquid application, vapor application, and/or plasma application to one or more surfaces to better enable surface tension forces to self-align components, such as the dummy pillars 130 to the dummy pads 160, and/or to reduce warpage.

Figure 7A:
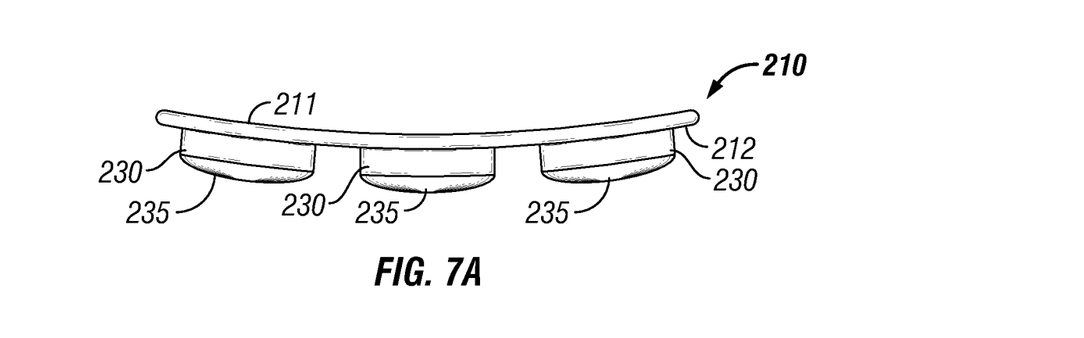
FIG. 7A is a schematic of an embodiment of a semiconductor device having a first warpage.
Figure 7B:
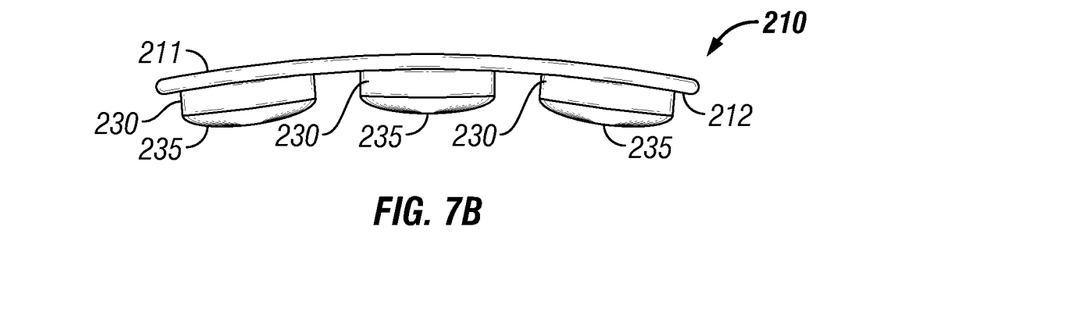
FIG. 7B is a schematic of an embodiment of a semiconductor device having a second warpage.

FIG. 7A is a schematic of an embodiment of a semiconductor device 210 having a first warpage and FIG. 7B is a schematic of an embodiment of a semiconductor device 210 having a second warpage. The first and second warpage are shown for illustrative purposes. The warpage may be convex, concave, or a different shape as would be appreciated by one of ordinary skill in the art having the benefit of this disclosure. The semiconductor device 210 includes a plurality of dummy pillars 230 that extend from a second surface 212 of the semiconductor device 210. The second surface 212 is opposite a first surface 211 of the semiconductor device 210. Fluid 235 is located on the end of the dummy pillars 230 extending from the second surface 212 of the semiconductor device 210.

Figure 8:
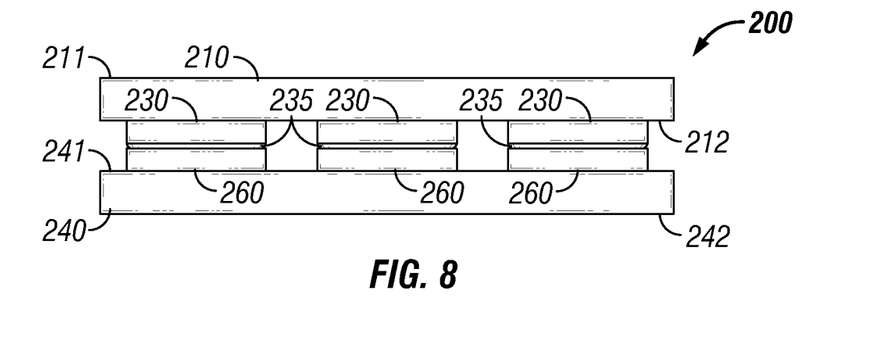
FIG. 8 is a schematic of an embodiment of a semiconductor device assembly.

FIG. 8 is a schematic of an embodiment of a semiconductor device assembly 200 that comprises the semiconductor device 210 connected to a first surface 211 of a substrate 240 that is opposite a second surface 212 of the substrate 240. The fluid 235 is positioned between a dummy pillar 230 and a corresponding dummy pad 260 on the first surface 241 of the substrate 240. The surface tension of the fluid 235 has reduced or minimized the warpage of the semiconductor device 210 in comparison FIGS. 7A and 7B. As shown in FIG. 8, the first surface 241 of the substrate 240 may not include recesses created by opening in a solder mask.

Figure 9:
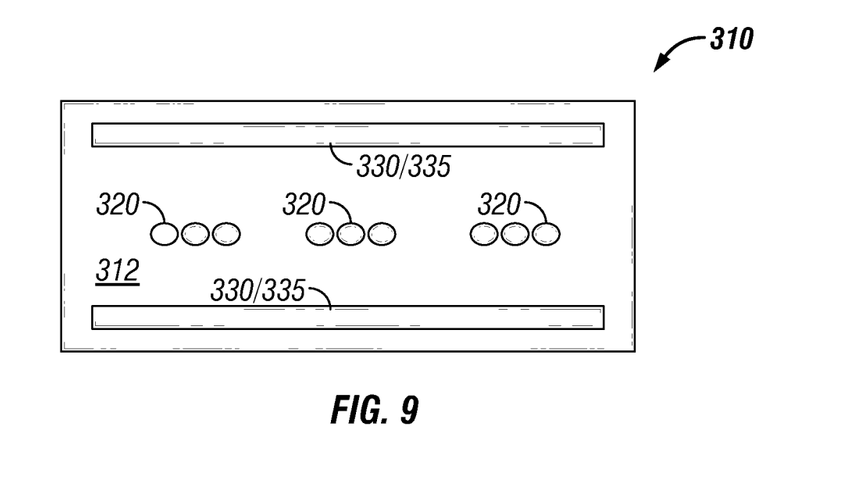
FIG. 9 is a schematic of an embodiment of a semiconductor device.

FIG. 9 is a schematic of an embodiment of a semiconductor device 310. The semiconductor device 310 may include a plurality of electrical interconnects 320 on a second surface 312 of the semiconductor device 310. A plurality of dummy pillars 330 may extend from the second, or bottom, surface 312 of the semiconductor device 310. Fluid 335 may be positioned on the ends of each of the dummy pillars 330. The dummy pillars 330 may be longitudinal in shape and run approximately a length of the second surface 312. The use of a few longitudinal dummy pillars 330 in comparison to a larger number of dummy pillars 330 spread out along the second surface 312 enable the surface tension of the fluid 335 to better reduce or minimize the warpage of the semiconductor device 310.

Figure 10:
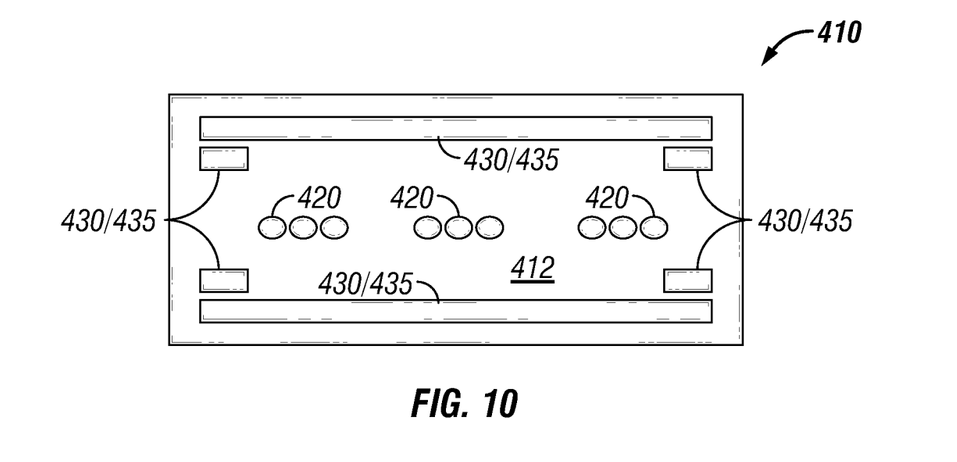
FIG. 10 is a schematic of an embodiment of a semiconductor device.

FIG. 10 is a schematic of an embodiment of a semiconductor device 410. The semiconductor device 410 may include a plurality of electrical interconnects 420 on a second surface 412 of the semiconductor device 410. A plurality of dummy pillars 430 may extend from the second, or bottom, surface 412 of the semiconductor device 410. Fluid 435 may be positioned on the ends of each of the dummy pillars 430. The dummy pillars 430 may be arranged in a pattern along the second surface 412 to better enable the surface tension of the fluid 435 to reduce or minimize the warpage of the semiconductor device 410. The dummy pillars 430 may be a combination of long longitudinal shaped pillars that run approximately a length of the second surface 312 along with shorter more discrete pillars 430 as shown in FIG. 10.

Figure 11:
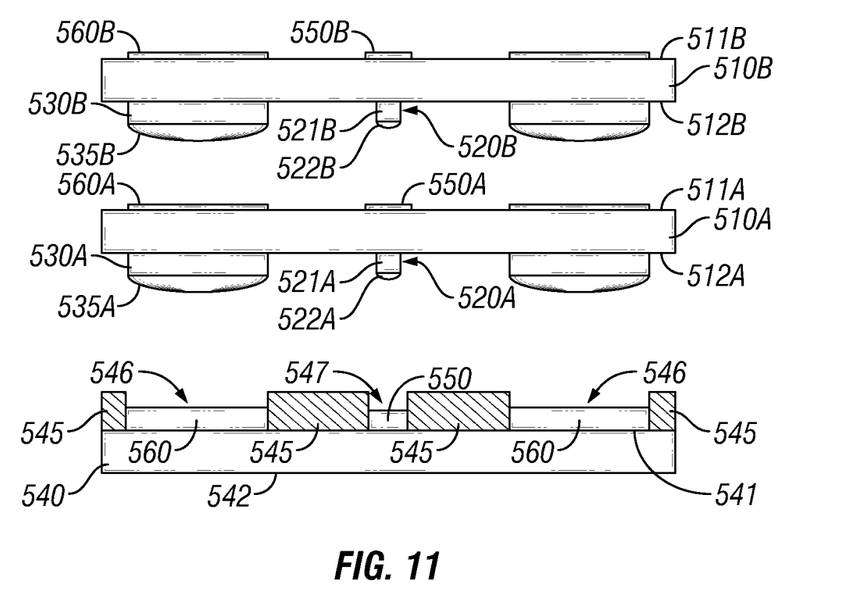
FIG. 11 is a schematic of an embodiment of semiconductor devices and a substrate being positioned adjacent to each other to form a semiconductor device assembly.

FIG. 11 is a side view schematic of a first semiconductor device 510A, a second semiconductor device 510B, and a substrate 540. The first semiconductor device 510A has a first, or top, side 511A and a second, or bottom, side 512A. Likewise, the second semiconductor device 510B has a first, or top, side 511B and a second, or bottom, side 512B. A plurality of electrical pillars 520A comprised of pillars 521A and solder 522A extend from the second side 512A of the first semiconductor device 510A and a plurality of electrical pillars 520B comprised of pillars 521B and solder 522B extend from the second side 512B of the second semiconductor device 510B. As discussed herein, the electrical pillars 520A, 520B are configured to make electrical interconnects between adjacent semiconductor devices and/or substrates. A plurality of dummy pillars 530A extend from the second side 512A of the first semiconductor device 510A and a plurality of dummy pillars 530B extend from the second side 512B of the second semiconductor device 510B with corresponding fluid 535A, 535B positioned on the ends of each dummy pillar 530A, 530B. As discussed herein, the surface tension of the fluid 535A, 535B may be used to align components and/or reduce warpage when forming a semiconductor device assembly.

The first, or top, side 511A of the first semiconductor device 510A includes a plurality of electrical pads 550A and dummy pads 560A. Likewise, the first, or top, side 511B of the second semiconductor device 510B includes a plurality of electrical pads 550B and dummy pads 560B. The number, location, size, and/or configuration of the electrical pillars 520A, 520B, dummy pillars 530A, 530B, fluid 535A, 535B, electrical pads 550A, 550B, and dummy pads 560A, 560B are shown for illustrative purposes and may be varied depending on the application as would be appreciated by one of ordinary skill in the art having the benefit of this disclosure.

The substrate 540 has a first, or top, side 541 and a second, or bottom, side 542. The first side 541 of the substrate 540 includes a plurality of electrical pads 550 that are configured to form electrical interconnects between the substrate 540 and an adjacent semiconductor device as discussed above. A solder mask 545 may be positioned on the first surface 541 of the substrate 540 and the electrical pads 550 may be positioned within openings of the solder mask 545 creating a recess or cavity 547. The first side 541 of the substrate 540 also includes a plurality of dummy pads 560 that are configured mate with the dummy pillars 530A that extend from the second side 512A of the first semiconductor device 510A. As discussed herein, the dummy pillars 530A and dummy pads 560 do not form electrical interconnects between the first semiconductor device 510A and the substrate 540. The dummy pads 560 may be positioned within openings of the solder mask 545 creating a recess or cavity 546 above the dummy pads 560. The recess or cavity 546 may be used to retain the fluid 535A that is positioned between the dummy pillars 530A and the dummy pads 560. The number, location, size, and/or configuration of the solder mask 545, electrical pads 550, and/or dummy pads 560 are shown for illustrative purposes and may be varied depending on the application as would be appreciated by one of ordinary skill in the art having the benefit of this disclosure.

Figure 12:
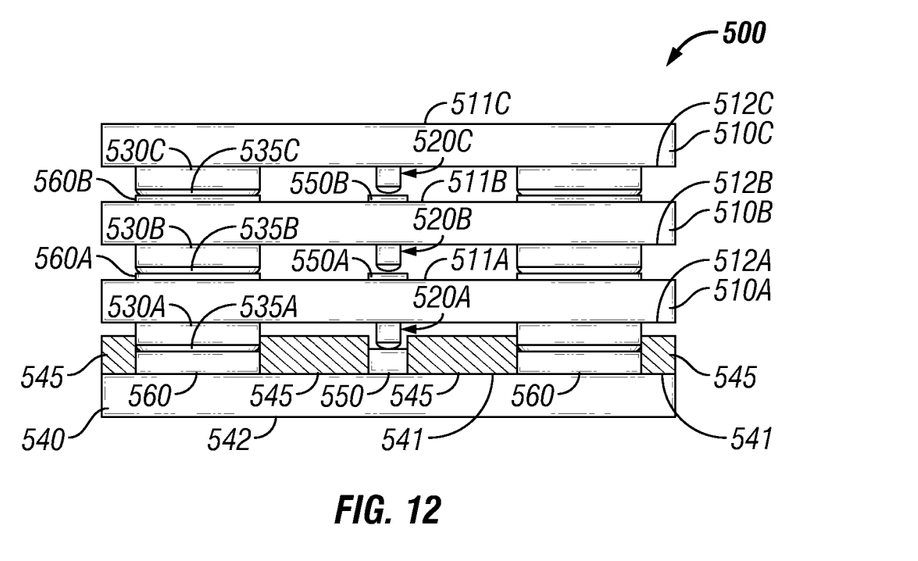
FIG. 12 is a schematic of an embodiment of a semiconductor device assembly.

FIG. 12 shows a side view schematic of the semiconductor device assembly 500 comprising the first semiconductor device 510A connected to the substrate 540. The first semiconductor device 510A is connected to the second semiconductor device 510B and the second semiconductor device 510B is connected to a third semiconductor device 510C. As would be appreciated by one of ordinary skill in the art, the number of semiconductor devices 510A, 510B, 510C may be more or less than three as shown in FIG. 12.

The electrical pillars 520A, 520B, 520C and electrical pads 550, 550A, 550B provide for electrical interconnections between the semiconductor devices 510A, 510B, 510C and the substrate 540 of the semiconductor device assembly 500. As discussed herein, the surface tension of the fluid 535A, 535B, 535C between the dummy pillars 530A, 530B, 530C and the dummy pads 560, 560A, 560B may be able align the respective components and/or reduce the warpage of components of the semiconductor device assembly 500 as the semiconductor device assembly is subjected to elevated temperatures during the formation process.

Figure 13:
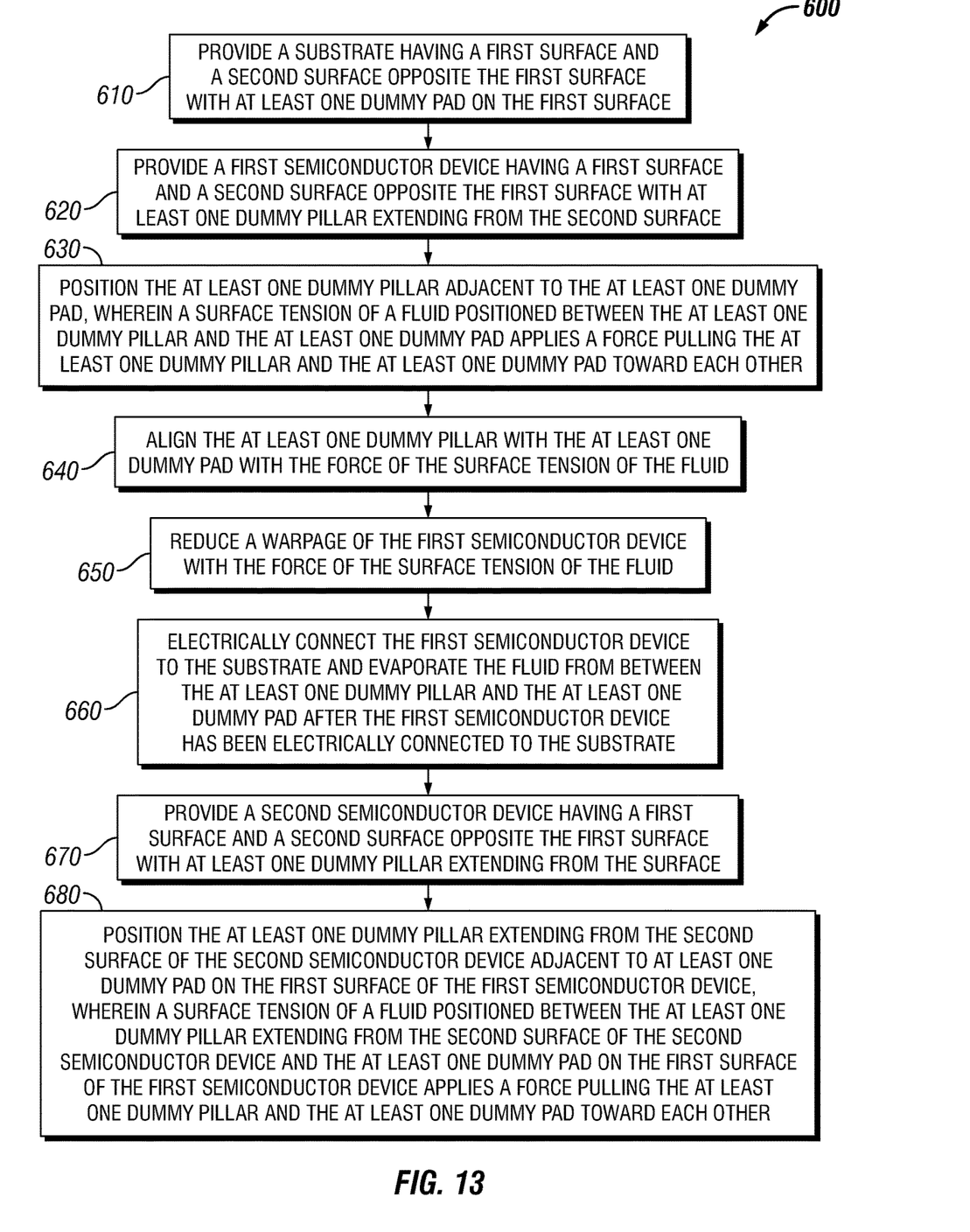
FIG. 13 is a flow chart of an embodiment of a method of making a semiconductor device assembly.

FIG. 13 is a flow chart of an embodiment of a method 600 of making a semiconductor device assembly. The method 600 comprises providing a substrate having a first surface and a second surface opposite the first surface with at least one dummy pad on the first surface, at 610. For example, the substrate 140 may include a plurality of dummy pads 160 on the first surface 141 of the substrate 140. The dummy pads 160 may be positioned within an opening in a solder mask 145 on the first surface 141.

The method 600 comprises providing a first semiconductor device having a first surface and a second surface opposite the first surface with at least one dummy pillar extending from the second surface, at 620. The method 600 comprises positioning the at least one dummy pillar adjacent to the at least one dummy pad, wherein a surface tension of a fluid positioned between the at least one dummy pillar and the at least one dummy pad applies a force pulling the at least one dummy pillar and the at least one dummy pad toward each other, at 630. As discussed herein, the fluid may be initially positioned on the end of the dummy pillar or may be positioned on the dummy pad.

The method 600 may comprise aligning the at least one dummy pillar with the at least one dummy pad with the force of the surface tension of the fluid, at 640. The force of the surface tension of the fluid may align the dummy pillar with the dummy pad as discussed herein. The method 600 may comprise reducing a warpage of the first semiconductor device with the force of the surface tension of the fluid, at 650. The force of the surface tension of the fluid may be able to reduce or minimize the warpage of the semiconductor device at an elevated temperature.

The method 600 may comprise electrically connecting the first semiconductor device to the substrate and evaporating the fluid from between the at least one dummy pillar and the at least one dummy pad after the first semiconductor device has been electrically connected to the substrate, at 660. After the first semiconductor has been electrically connected to the substrate, the fluid positioned between the dummy pillars and dummy pads may be evaporated from the semiconductor device assembly depending on the fluid used. For example, if water is used to apply the force between the dummy pad and the dummy pillar, the fluid may be evaporated from the semiconductor device assembly once the semiconductor device and the substrate are connected together. Various fluids may be used to apply the force between the dummy pad and dummy pillar that may be evaporated once the semiconductor device and substrate are connected together such as, but not limited to, glycerol, diiodomethane, and formamide, as would be appreciated by one of ordinary skill in the art having the benefit of this disclosure. Alternatively, the fluid used to apply the force between the dummy pad and dummy pillar may be washed away from the semiconductor device assembly once the semiconductor device and substrate are connected together. For example, water or an organic solvent may be applied to the semiconductor device assembly to remove the fluid once the semiconductor device and substrate are connected together.

The method 600 may comprise providing a second semiconductor device having a first surface and a second surface opposite the first surface with at least one dummy pillar extending from the second surface, at 670. The method 600 may comprise positioning the at least one dummy pillar extending from the second surface of the second semiconductor device adjacent to at least one dummy pad on the first surface of the first semiconductor device, wherein a surface tension of a fluid positioned between the at least one dummy pillar extending from the second surface of the second semiconductor device and the at least one dummy pad on the first surface of the first semiconductor device applies a force pulling the at least one dummy pillar and the at least one dummy pad toward each other, at 680.

Figure 14:
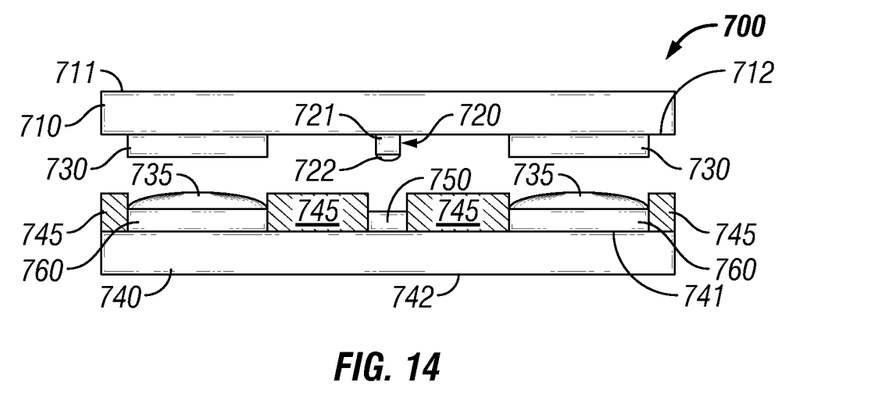
FIG. 14 is a schematic of an embodiment of a semiconductor device and a substrate being positioned adjacent to each other to form a semiconductor device assembly.

FIG. 14 shows a side view schematic of the semiconductor device 710 being positioned adjacent to the substrate 740 in the process of forming a semiconductor device assembly 700. The semiconductor device 710 includes a first side 711 and a second side 712. Electrical pillars 720 comprised of pillars 721 and solder 722 extend from the second side 712 of the semiconductor device 712. The electrical pillars 720 are configured to engage electrical pads 750 on the first side 741 of the substrate 740 to form electrical interconnects between the semiconductor device 710 and the substrate 740 as discussed herein. The semiconductor device 710 includes dummy pillars 730 that extend from the second surface 712 of the semiconductor deice 710.

The substrate 740 includes a first side 741 and a second side 742 opposite of the first side. The substrate 740 includes electrical pads 750 positioned within openings in a solder mask 745 on the first side 711 and dummy pads 760 also positioned within openings in the solder mask 745. Fluid 735 is positioned on the dummy pads 760. As the semiconductor device 710 and substrate 740 are brought together, the surface tension of the fluid 735 positioned on each dummy pad 760 pulls the dummy pillars 730 and corresponding dummy pads 760 together. The pulling force of the fluid 735 may be used to align the dummy pillars 730 with a corresponding dummy pad 760 and/or may reduce a warpage of the semiconductor device 710 and/or the substrate 740.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
   a substrate having a first side and a second side, the first side having at least one dummy pad and at least one electrical pad, wherein the at least one dummy pad has a first area and the at least one electrical pad has a second area, the first area being at least two times as large as the second area:
   a first semiconductor device having a first side and a second side;
   at least one electrical pillar extending from the second side of the first semiconductor device, the at least one electrical pillar connected to the at least one electrical pad via solder to form an electrical interconnect between the first semiconductor device and the substrate;
   at least one dummy pillar extending from the second side of the first semiconductor device;
   a first liquid positioned between an end of the at least one dummy pillar and the at least one dummy pad, wherein a surface tension of the first liquid pulls the at least one dummy pillar towards the at least one dummy pad.

2. The semiconductor device assembly of claim 1, wherein the surface tension of the first liquid reduces a warpage of the first semiconductor device.

3. The semiconductor device assembly of claim 1, wherein the surface tension of the first liquid aligns the at least one dummy pillar with the at least one dummy pad.

4. The semiconductor device assembly of claim 1, wherein the first liquid is solder and the at least one dummy pad is a dummy metal pad.

5. The semiconductor device assembly of claim 1, wherein the at least one dummy pad is positioned within a recess on the first side of the substrate.

6. The semiconductor device assembly of claim 5, wherein the recess is a recess within a solder mask layer on the first side of the substrate.

7. The semiconductor device assembly of claim 1, wherein the first side of the first semiconductor device includes at least one dummy pad and at least one electrical pad.

8. The semiconductor device assembly of claim 7, comprising:
   a second semiconductor device having a first side and a second side;
   at least one electrical pillar extending from the second side of the second semiconductor device, the at least one electrical pillar extending from the second side of the second semiconductor device connected via solder to the at least one electrical pad on the first side of the first semiconductor device to form an electrical interconnect between the first semiconductor device and the second semiconductor device;
   at least one dummy pillar extending from the second side of the second semiconductor device;
   a liquid positioned between an end of the at least one dummy pillar extending from the second surface of the second semiconductor device and the at least one dummy pad on the first surface of the first semiconductor device, wherein a surface tension of the liquid pulls the at least one dummy pillar extending from the second semiconductor device towards the at least one dummy pad on the first semiconductor device.

9. The semiconductor device assembly of claim 8, wherein the surface tension of the second liquid aligns the second semiconductor device with the first semiconductor device.

10. The semiconductor device assembly of claim 9, wherein the surface tension of the second liquid reduces a warpage of the second semiconductor device.

11. The semiconductor device assembly of claim 1, wherein the fluid differs from the solder that connects the at least one electrical pillar connected to the at least one electrical pad.

12. The semiconductor device assembly of claim 1, wherein the fluid is water, glycerol, diiodomethane, formamide, epoxy resin, or a combination thereof.

13. A semiconductor device comprising:
a substrate having a first side and a second side, the first side having an area;
a plurality of electrical pads on the first side, each of the plurality of electrical pads configured to be connected to an electrical pillar to form an electrical interconnect; and
a plurality of dummy pads on the first side, each of the plurality of dummy pads configured to be aligned with a plurality of pillars via surface tension of a fluid to be positioned between each of the plurality of dummy pads and a corresponding pillar of the plurality of pillars, wherein the fluid is water, glycerol, diiodomethane, formamide, epoxy resin, or a combination thereof.

14. The semiconductor device of claim 13, wherein the plurality of dummy pads have a combined area that is at least ⅛ as large as the area of the first side of the substrate.

15. The semiconductor device of claim 13, wherein the surface tension of the fluid applies a force that is greater than a warpage force of the substrate at a predetermined temperature.

16. The semiconductor device of claim 15, wherein the predetermined temperature is 200 degrees Celsius or higher.

* * * * *